(12) United States Patent
Kim

(10) Patent No.: US 9,704,889 B2
(45) Date of Patent: Jul. 11, 2017

(54) DISPLAY PANEL AND DISPLAY DEVICE COMPRISING THE SAME

(71) Applicant: Samsung Display Co., Ltd., Yongin-si, Gyeonggi-Do (KR)

(72) Inventor: Duk Sung Kim, Asan-si (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 185 days.

(21) Appl. No.: 14/636,675

(22) Filed: Mar. 3, 2015

(65) Prior Publication Data
US 2016/0048046 A1    Feb. 18, 2016

(30) Foreign Application Priority Data
Aug. 14, 2014    (KR) ........................ 10-2014-0105637

(51) Int. Cl.
| | | |
|---|---|---|
| G02F 1/1368 | (2006.01) | |
| G02F 1/1362 | (2006.01) | |
| H01L 27/12 | (2006.01) | |
| G02F 1/1343 | (2006.01) | |

(52) U.S. Cl.
CPC ........ H01L 27/124 (2013.01); G02F 1/13624 (2013.01); G02F 1/136213 (2013.01); G02F 1/136286 (2013.01); G02F 2001/134354 (2013.01)

(58) Field of Classification Search
CPC ........... G02F 1/13624; G02F 1/136213; G02F 1/136286; G02F 2001/134354; H01L 27/124
See application file for complete search history.

(56) References Cited

U.S. PATENT DOCUMENTS

| | | | |
|---|---|---|---|
| 8,259,053 B2* | 9/2012 | Shin ................. | G02F 1/134363 345/87 |
| 2007/0182680 A1* | 8/2007 | Jeon ................. | G02F 1/136213 345/87 |
| 2009/0295693 A1 | 12/2009 | Yeom et al. | |
| 2010/0123842 A1 | 5/2010 | Lee et al. | |
| 2010/0157185 A1* | 6/2010 | Kim ..................... | G02F 1/1362 349/38 |

(Continued)

FOREIGN PATENT DOCUMENTS

| | | |
|---|---|---|
| KR | 10-2009-0062112 A | 6/2009 |
| KR | 10-2009-0123738 A | 12/2009 |
| KR | 10-2010-0055154 A | 5/2010 |

*Primary Examiner* — Ryan Crockett
(74) *Attorney, Agent, or Firm* — Robert E. Bushnell, Esq.

(57) ABSTRACT

A display panel includes: a pixel electrode comprising first, second, and third sub-pixel electrodes that are separated from each other; a first thin film transistor connected to the first sub-pixel electrode; second and fourth thin film transistors connected to the second sub-pixel electrode; third and fifth thin film transistors connected to the third sub-pixel electrode; a first gate line connected to the first to fourth thin film transistors; a second gate line connected to the fifth thin film transistor; a data line insulated from and intersecting the first and second gate lines and connected to the first to third thin film transistors; a first storage electrode line disposed adjacent to the first gate line; and a second storage electrode line disposed adjacent to the second gate line.

19 Claims, 6 Drawing Sheets

(56) References Cited

U.S. PATENT DOCUMENTS

2011/0261293 A1* 10/2011 Kimura .............. G02F 1/13624
  349/74
2011/0309367 A1   12/2011 Um et al.
2012/0224128 A1*  9/2012 Jung ................. G02F 1/134309
  349/129
2013/0215341 A1*  8/2013 Rho .................. G02F 1/134309
  349/15

* cited by examiner

DISPLAY PANEL AND DISPLAY DEVICE COMPRISING THE SAME

CLAIM PRIORITY

This application makes reference to, incorporates the same herein, and claims all benefits accruing under 35 U.S.C. §119 from an application earlier filed in the Korean Intellectual Property Office on 14 Aug. 2014 and there duly assigned Serial No. 10-2014-0105637.

BACKGROUND

1. Field

Aspects of embodiments of the present invention generally relate to a display panel designed to achieve a wide viewing angle and improve light transmittance and to a display device including the display panel.

2. Description of the Related Art

A liquid crystal display (LCD) is a type of flat panel displays (FPDs), which is the most widely used these days. The LCD includes two substrates including electrodes formed thereon and a liquid crystal layer interposed therebetween. Upon applying voltage to two electrodes, liquid crystal molecules of the liquid crystal layer are rearranged, thereby adjusting the amount of transmitted light.

Such LCD may be categorized into a twisted nematic mode, a vertically aligned mode, a fringe field switch mode and an in-plane switching mode according to an arrangement of liquid crystal molecules or electrodes when an electric field is not formed.

In case of the vertically aligned mode of the LCD, a method has been studied where one pixel is divided into a plurality of sub-pixels and voltage of different levels are respectively applied to the sub-pixels to impart different transmittances thereto, so as to achieve side visibility similar to front visibility.

It is to be understood that this Related Art section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY OF THE INVENTION

The present disclosure of invention is directed to a display panel designed to achieve a wide viewing angle and improve light transmittance and to a display device including the display panel.

According to an embodiment of the present invention, a display panel includes: a pixel electrode comprising first, second, and third sub-pixel electrodes that are separated from each other; a first thin film transistor connected to the first sub-pixel electrode; second and fourth thin film transistors connected to the second sub-pixel electrode; third and fifth thin film transistors connected to the third sub-pixel electrode; a first gate line connected to the first to fourth thin film transistors; a second gate line connected to the fifth thin film transistor; a data line insulated from and intersecting the first and second gate lines and connected to the first to third thin film transistors; a first storage electrode line disposed adjacent to the first gate line; and a second storage electrode line disposed adjacent to the second gate line.

The first to third sub-pixel electrodes may be sequentially disposed between the first and second gate lines.

The first to third sub-pixel electrodes may be respectively applied with voltage different from each other.

The voltage applied to the first sub-pixel electrode may be higher than the voltage applied to the second and third sub-pixel electrodes and the voltage applied to the third sub-pixel electrode may be higher than the voltage applied to the second sub-pixel electrode.

One of the first to third sub-pixel electrodes may include a plurality of slits.

The first to third thin film transistors may include: a gate electrode connected to the first gate line, a source electrode connected to the data line, and a drain electrode respectively connected to the first to third sub-pixel electrodes, and the gate and source electrodes of the first to third thin film transistors may be respectively connected to each other.

The drain electrode of the third thin film transistor may overlap the first and second sub-pixel electrodes.

The fourth thin film transistor may include a gate electrode connected to the first gate line, a source electrode connected to the second sub-pixel electrode, and a drain electrode connected to the first storage electrode.

The first storage electrode may be connected to the first storage electrode line.

The fifth thin film transistor may include a gate electrode connected to the second gate line, a source electrode connected to the third sub-pixel electrode, and a drain electrode connected to the second storage electrode.

The second storage electrode may overlap the second storage electrode line.

The second storage electrode may overlap the first sub-pixel electrode.

According to an embodiment of the present invention, a display device includes: a first substrate; gate and data lines intersecting each other on the first substrate; a storage electrode line disposed in parallel with the gate line; a pixel respectively connected to the gate, data, and storage-electrode lines; a second substrate facing the first substrate and comprising a common electrode; and a liquid crystal layer interposed between the first and second substrates, wherein the pixel may include: a pixel electrode comprising first, second, and third sub-pixel electrodes that are separated from each other, and a thin film transistor comprising a first thin film transistor connected to the first sub-pixel electrode, second and fourth thin film transistors connected to the second sub-pixel electrode; and third and fifth thin film transistors connected to the third sub-pixel electrode.

The gate line may include a first gate line and a second gate line spaced apart from the first gate line, and the first to fourth thin film transistors may be connected to the first gate line and the fifth thin film transistor may be connected to the second gate line.

The storage electrode line may include a first storage electrode line disposed adjacent to the first gate line and a second storage electrode line disposed adjacent to the second gate line, the fourth thin film transistor may be connected to the first storage electrode line, and the fifth thin film transistor may overlap the second storage electrode line.

The first to third sub-pixel electrodes may be sequentially disposed between the first and second gate lines.

The first to third sub-pixel electrodes may be respectively applied with voltage different from each other.

The voltage applied to the first sub-pixel electrode may be higher than the voltage applied to the second and third sub-pixel electrodes and the voltage applied to the third sub-pixel electrode may be higher than the voltage applied to the second sub-pixel electrode.

One of the first to third sub-pixel electrodes may include a plurality of slits.

According to embodiments of the present invention, a display panel and a display device including the display panel may achieve a wide viewing angle and be improved in light transmittance.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION

Figure 1:
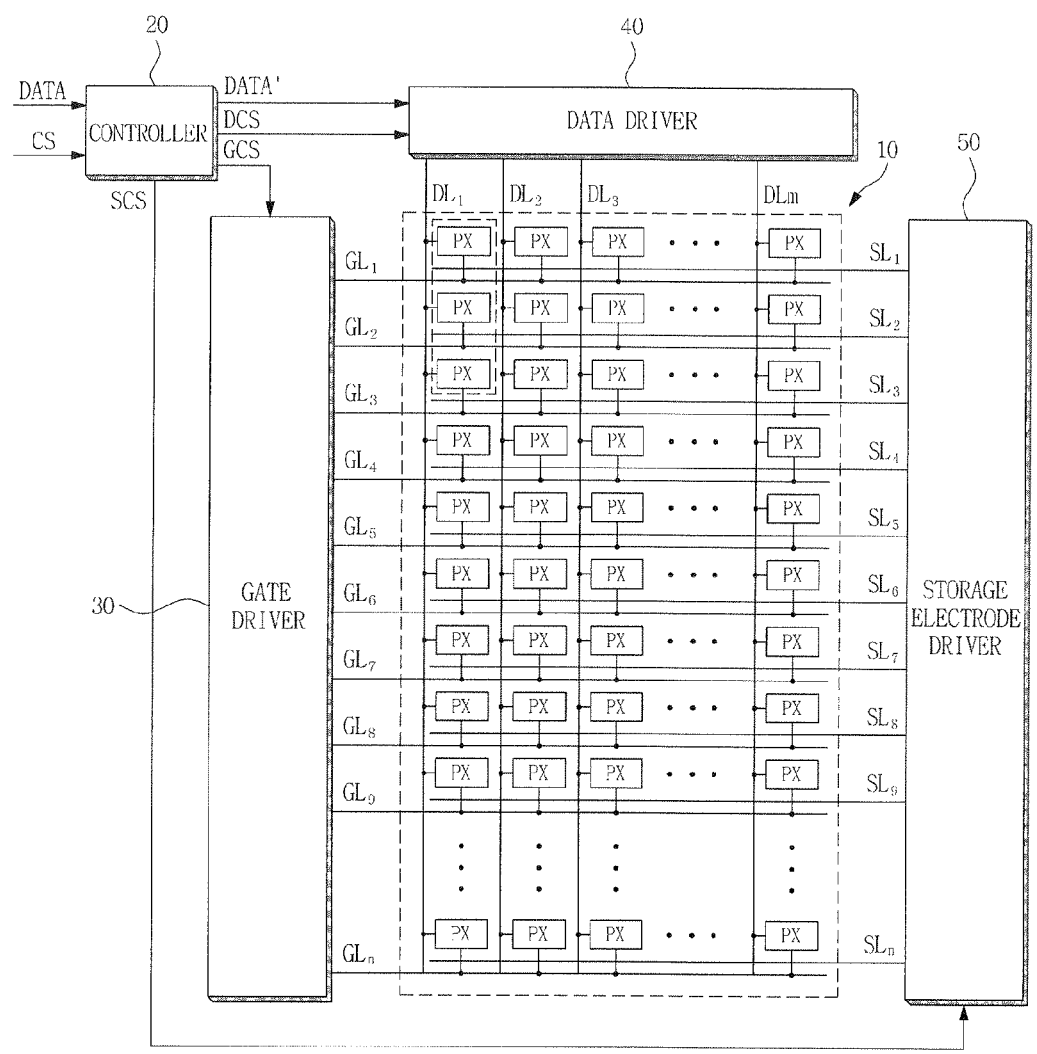
FIG. 1 is a block diagram illustrating a display device according to one embodiment of the present invention.

Advantages and features of the present invention and methods for achieving them will be made clear from embodiments described below in detail with reference to the accompanying drawings. The present invention may, however, be embodied in many different forms and should not be construed as being limited to the embodiments set forth herein. Rather, these embodiments are provided so that this disclosure will be thorough and complete, and will fully convey the scope of the invention to those skilled in the art. The present invention is merely defined by the scope of the claims. Therefore, well-known constituent elements, operations and techniques are not described in detail in the embodiments in order to prevent the present invention from being obscurely interpreted. Like reference numerals refer to like elements throughout the specification.

The spatially relative terms "below", "beneath", "lower", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device shown in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Figure 2:
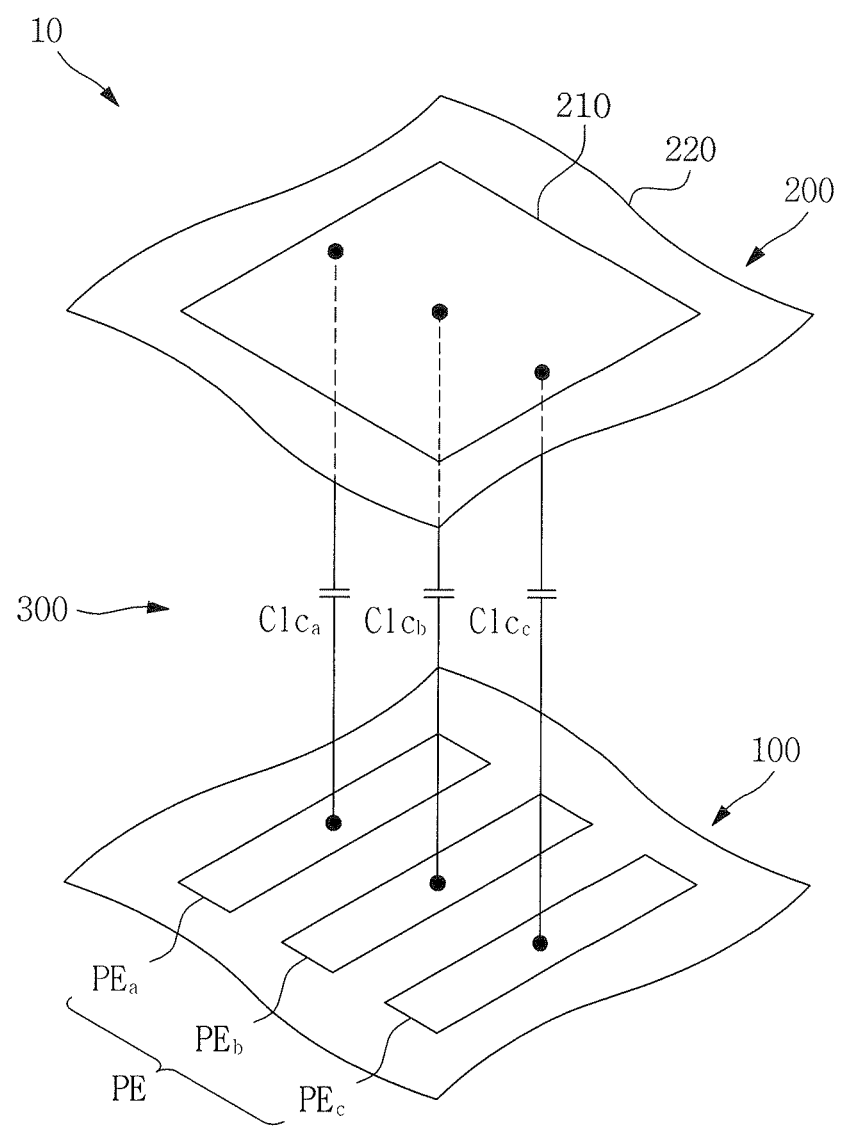
FIG. 2 is an equivalent circuit diagram illustrating a configuration of the display device of FIG. 1 and three sub-pixels.

FIG. 1 is a block diagram illustrating a display device according to one embodiment of the present invention and FIG. 2 is an equivalent circuit diagram illustrating a configuration of the display device of FIG. 1 and three sub-pixels.

Referring to FIGS. 1 and 2, the display device according to one embodiment of the present invention may include a display panel 10 including a plurality of pixels PXs, a controller 20 configured to process an image signal DATA and a control signal CS supplied from the outside and output a variety of signals, a gate driver 30 configured to supply a gate signal to gate lines GL1~GLn connected to the pixels PXs, a data driver 40 configured to supply a data signal to data lines DL1~DLm connected to the pixels PXs, and a storage electrode driver 50 configured to supply a storage electrode signal to storage electrode lines SL1~Sln connected to the pixels PXs.

The display panel 10 may include the plurality of gate lines GL1~GLn configured to supply the gate signal in a low direction, the plurality of storage electrode lines SL1~SLn configured to supply the storage electrode signal in the low direction, the plurality of data lines DL1~DLm configured to supply the data signal in a column direction, and the plurality of pixels PXs arranged in a matrix form connected to the gate and data lines.

The display panel 10 may include separately formed first substrate 100 and second substrate 200, which may be disposed to face the first substrate 100, and a liquid crystal layer 300 interposed between the first and second substrates 100 and 200.

A pixel electrode PE including sub-pixel electrodes PEa, PEb, and PEc may be disposed on the first substrate 100. A color filter 210 and a common electrode 220 may be disposed on the second substrate 200. The sub-pixel electrodes PEa, PEb, and PEc, the common electrode 220, and the liquid crystal layer 300 may form liquid crystal capacitors $Clc_a$, $Clc_b$, and $Clc_c$. However, embodiments of the present invention are not limited thereto, and thus the color filter 210 may be formed on the pixel electrode PE of the first substrate.

The controller 20 may be configured to output a corrected image signal DATA' to the data driver 40 based on the image signal DATA supplied from the outside. Further, the controller 20 may apply, based on the control signal CS supplied from the outside, a gate control signal GCS to the gate driver 30, a data control signal DCS to the data driver 40, and a storage electrode control signal to the storage electrode driver 50. For example, the control signal CS may be a timing signal such as a vertical synchronization signal Vsync, a horizontal synchoronization signal Hsync, a clock signal CLK, and a data enable signal DE. Further, the image signal DATA may be a digital signal expressing a gray level of light emitted from the pixel PX.

The gate driver 30 may be configured to receive the gate control signal GCS from the controller 20 to generate the gate signal, and supply the gates signal to the pixels PXs respectively connected to the plurality of gate lines GL1~GLn. As the gate signals are sequentially inputted to the pixel PX, the data signals may be sequentially applied to the pixel PX.

The data driver 40 may be configured to receive the data control signal DCS and the corrected image signal DATA' from the controller 20 and, in response to the data control signal DCS, supply a data signal corresponding to the corrected image signal DATA' to the pixels PXs respectively connected to the plurality of data lines DL1~DLm. The data signal may be expressed as a data voltage.

The storage electrode driver 50 may be configured to receive the storage electrode control signal from the controller 20 to generate the storage electrode signal, and supply the storage electrode signal to the plurality of storage electrode lines SL1~SLn. The storage electrode signal may be expressed as a storage electrode voltage.

Figure 3:
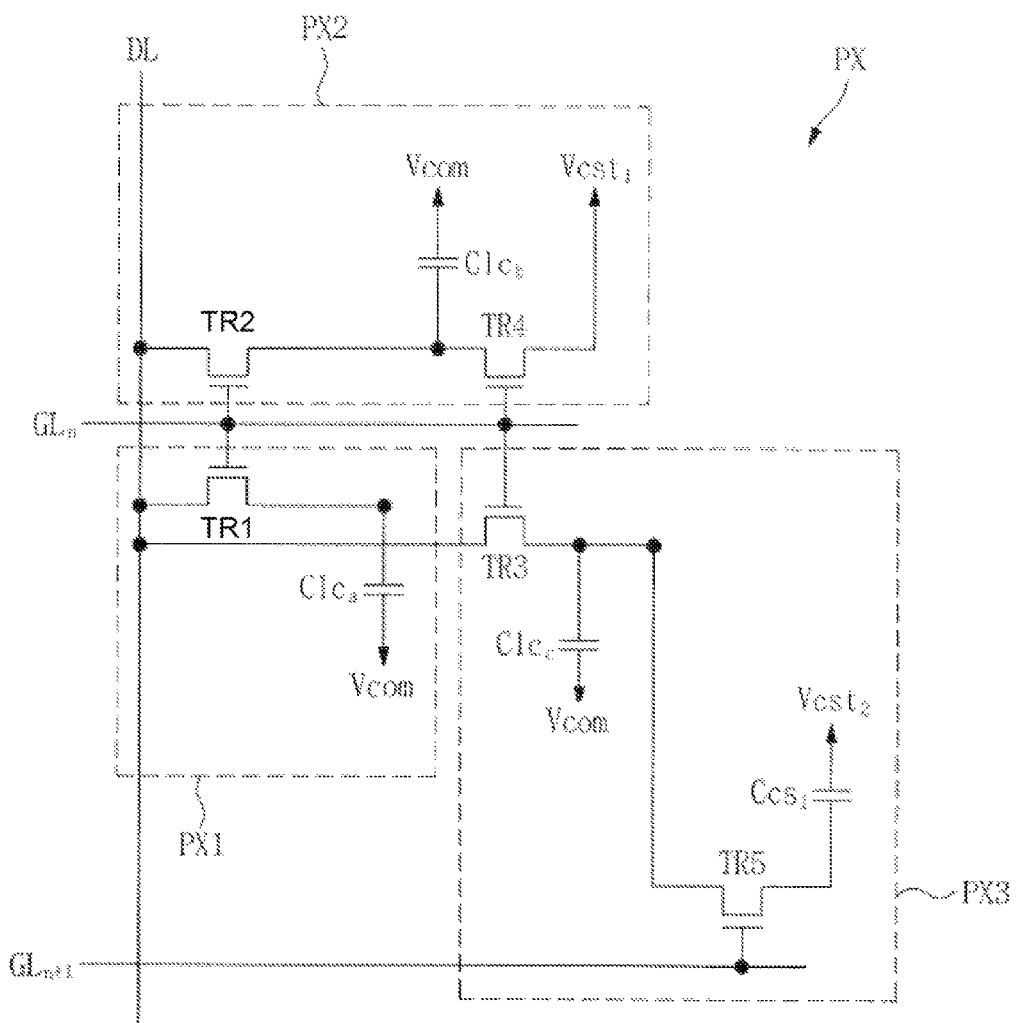
FIG. 3 is an equivalent circuit diagram illustrating one pixel of a display panel according to one embodiment of the present invention.
Figure 4:
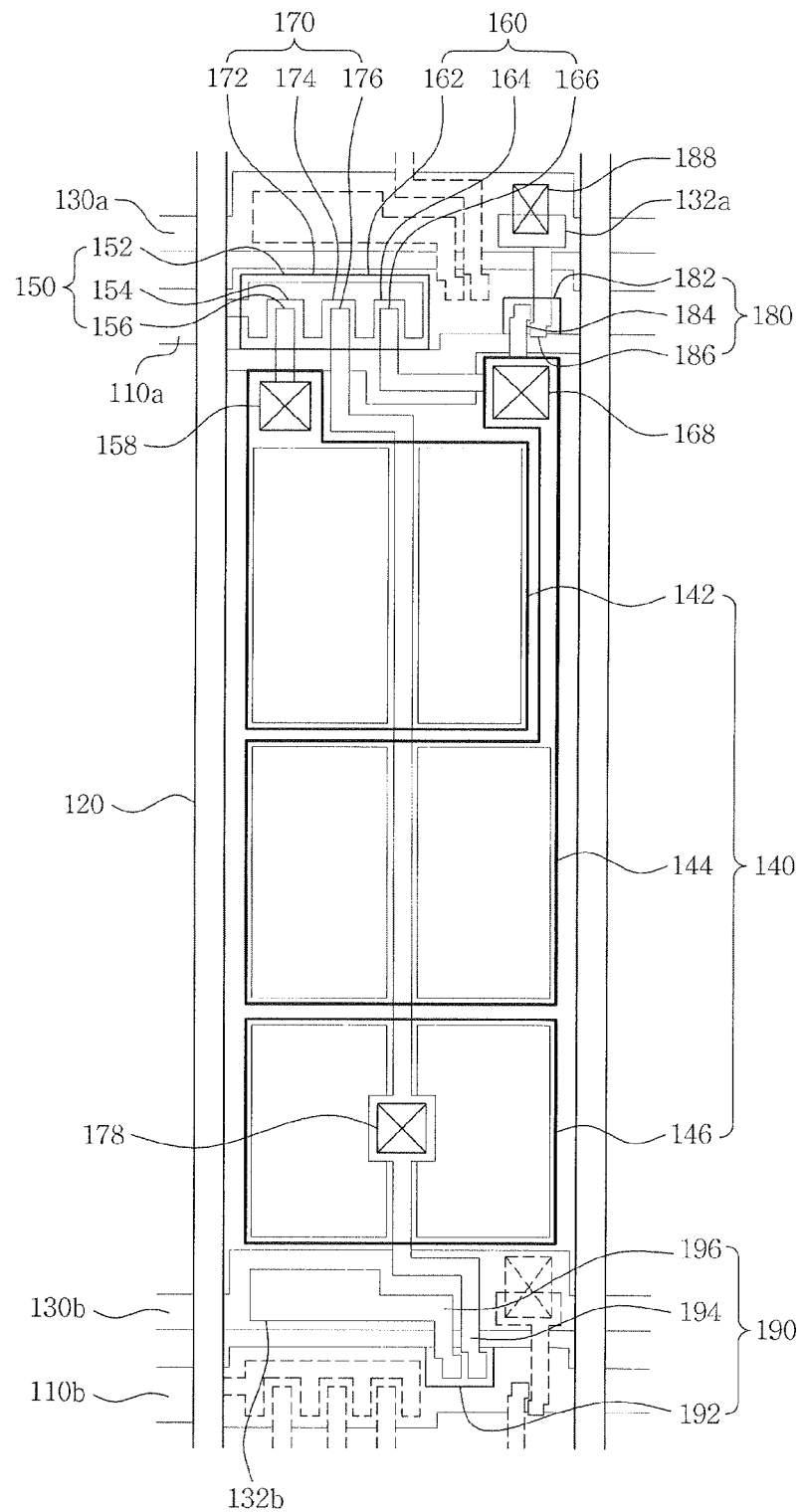
FIG. 4 is a plan view illustrating the display panel of FIG. 3.

FIG. 3 is an equivalent circuit diagram illustrating one pixel of a display panel according to one embodiment of the present invention and FIG. 4 is a plan view illustrating the display panel of FIG. 3.

Referring to FIG. 3, one pixel PX may include first, second, and third sub-pixels PX1, PX2, and PX3. The first, second, and third sub-pixels PX1, PX2, and PX3 may respectively include first, second, and third thin film transistors TR1, TR2, and TR3 connected to the same gate line GLn and the data line DL.

Each control terminal of the first, second, and third thin film transistors TR1, TR2, and TR3 may be connected to the first gate line GLn. Further, each input terminal of the first, second, and third thin film transistors TR1, TR2, and TR3 may be connected to the same data line DL.

In the first thin film transistor TR1, an output terminal may be connected to the first sub-pixel electrode of the first sub-pixel PX1 and the first sub-pixel electrode may form the first liquid crystal capacitor $Clc_a$ along with a common electrode disposed on the second substrate and the liquid crystal layer. The common electrode may be applied with a common voltage Vcom.

In the second thin film transistor TR2, an output terminal may be connected to the second sub-pixel electrode of the second sub-pixel PX2 and the second sub-pixel electrode may form the second liquid crystal capacitor $Clc_b$ along with a common electrode disposed on the second substrate and the liquid crystal layer. The common electrode may be applied with the common voltage Vcom.

In the third thin film transistor TR3, an output terminal of may be connected to the third sub-pixel electrode of the third sub-pixel PX3 and the third sub-pixel electrode may form the third liquid crystal capacitor $Clc_c$ along with a common electrode disposed on the second substrate and the liquid crystal layer. The common electrode may be applied with the common voltage Vcom.

The second sub-pixel PX2 may further include a fourth thin film transistor TR4. In the fourth thin film transistor TR4, a control terminal may be connected to the first gate line $GL_n$, an input terminal may be connected to the output terminal of the second thin film transistor TR2, namely the second sub-pixel electrode, and the output terminal may be connected to one end of the first storage electrode. The other end of the first storage electrode may be connected to the first storage electrode line (not illustrated. Further, the first storage electrode may be applied with a first storage voltage $Vcst_1$.

The third sub-pixel PX3 may further include a fifth thin film transistor TR5. In the fifth thin film transistor TR5, a control terminal may be connected to the second gate line $GL_{n+1}$, an input terminal may be connected to the output terminal of the third thin film transistor TR3, namely the third sub-pixel electrode, and the output terminal may be connected to the second storage electrode.

When the gate signal may be applied to the first gate line $GL_n$, the data voltage may be applied from the data line DL to the first to third sub-pixel electrodes via the first to third thin film transistors TR1, TR2, and TR3.

In the first sub-pixel electrode PX1, the total data voltage may be applied to the first sub-pixel electrode.

In the second sub-pixel electrode PX2, only a fraction of the data voltage may be applied to the second sub-pixel electrode and the other fraction of the data voltage may be transmitted to the first storage electrode via the fourth thin film transistor TR4. Accordingly, the data voltage applied to the second sub-pixel electrode may be subject to the voltage division according to resistance of the fourth thin film transistor TR4 itself and the first storage voltage $Vcst_1$ applied to the first storage electrode. Especially, the data voltage applied to the second sub-pixel electrode may be adjusted by changing the first storage voltage $Vcst_1$.

When the gate signal may be applied to the first gate line $GL_n$, the total data voltage may be applied to the third sub-pixel electrode. In contrary, when the gate signal may be applied to the second gate line $GL_{n+1}$, a fraction of the supplied data voltage may be transmitted to the second storage electrode via the fifth thin film transistor TR5. The data voltage stored in the second storage electrode forms a first charge share capacitor $Ccs_1$.

Accordingly, the first to third sub-pixel electrodes may be respectively applied with data voltage different from each other and may respectively have luminance different from each other. The display device according to an embodiment of the present invention may suitably adjust data voltage levels respectively applied to the second and third sub-pixel electrodes, thereby achieving a wide viewing angle. That is, an image viewed from the side may become most similar to an image viewed from the front side.

Referring to FIG. 4, first and second gate lines 110*a* and 110*b* may be spaced apart from each other and the data line 120 may intersect the first and second gate lines 110*a* and 110*b*. A first storage electrode line 130*a* may be disposed adjacent to the first gate line 110*a* and a second storage electrode line 130*b* may be disposed adjacent to the second gate line 110*b*. Although not illustrated, the first gate line 110*a*, the second gate line 110*b*, the data line 120, the first storage electrode line 130*a*, and the second storage electrode line 130*b* may be disposed on the first substrate.

A pixel electrode 140 may include first, second, and third sub-pixel electrodes 142, 144, and 146.

The first to third sub-pixel electrodes 142, 144, and 146 may be respectively applied with voltage different from each other. It is desirable that the voltage applied to the first sub-pixel electrode 142 is higher than the voltage applied to the second and third sub-pixel electrodes 144 and 146 and the voltage applied to the third sub-pixel electrode 146 is higher than the voltage applied to the second sub-pixel electrode 144.

The first to third sub-pixel electrodes 142, 144, and 146 may be separated from each other and sequentially disposed between the first gate line 110*a* and the second gate line 110*b*. The first to third sub-pixel electrodes 142, 144, and 146 may have a quadrangular shape. The first to third sub-pixel electrodes may, however, be embodied in many different forms and the present invention should not be construed as being limited to the forms described above.

The first to third sub-pixel electrodes 142, 144, and 146 may be divided by a plurality chevron patterns (not illustrated) formed by an opening or protrusion and may include a plurality of slits (not illustrated).

A first thin film transistor 150 may include a first gate electrode 152 connected to the first gate line 110*a*, a first source electrode 154 connected to the data line 120, and a first drain electrode 156 connected to the first sub-pixel electrode 142 through a first contact hole 158.

A second thin film transistor 160 may include a second gate electrode 162 connected to the first gate line 110*a*, a second source electrode 164 connected to the data line 120, and a second drain electrode 166 connected to the second sub-pixel electrode 144 through a second contact hole 168.

A third thin film transistor 170 may include a third gate electrode 172 connected to the first gate line 110*a*, a third source electrode 174 connected to the data line 120, and a third drain electrode 176 connected to the third sub-pixel electrode 146 through a third contact hole 178. The third drain electrode 176 may overlap the first sub-pixel electrode 142 and the second sub-pixel electrode 144 and may be connected to the third sub-pixel electrode 146 across the first sub-pixel electrode 142 and the second sub-pixel electrode 144.

The first to third gate electrodes 152, 162, and 172 may be integrally formed. The first to third source electrodes 154, 164, and 174 may be bent into a U-shape and connected to each other. However, embodiments of the present invention are not limited thereto. Thus, the first to third gate electrodes may be separately formed and may be bent into a W-shape or other shapes.

A fourth thin film transistor 180 may include a fourth gate electrode 182 connected to the first gate line 110*a*, a fourth source electrode 184 connected to the second drain electrode 166, namely the second sub-pixel electrode 144 through the second contact hole 168, and a fourth drain electrode 186 connected to a first storage electrode 132*a* through a fourth contact hole 188.

The first storage electrode 132*a* may be connected to the first storage electrode line 130*a* and a predetermined storage voltage may be applied over the first storage electrode line 130*a*. That is, voltage applied to the second sub-pixel electrode 144 via the second thin film transistor 160 may vary in accordance with the storage voltage applied to the first storage electrode 132*a*.

A fifth thin film transistor 190 may include a fifth gate electrode 192 connected to the second gate line 110*b*, a fifth source electrode 194 connected to the third drain electrode 176, namely the third sub-pixel electrode 146 through the third contact hole 178, and a fifth drain electrode 196 connected to the second storage electrode 132*b*. In other words, when the gate signal may be applied to the second gate line 110*b*, a fraction of the data voltage applied to the third sub-pixel electrode 146 may be stored in the second storage electrode 132*b*.

Figure 5:
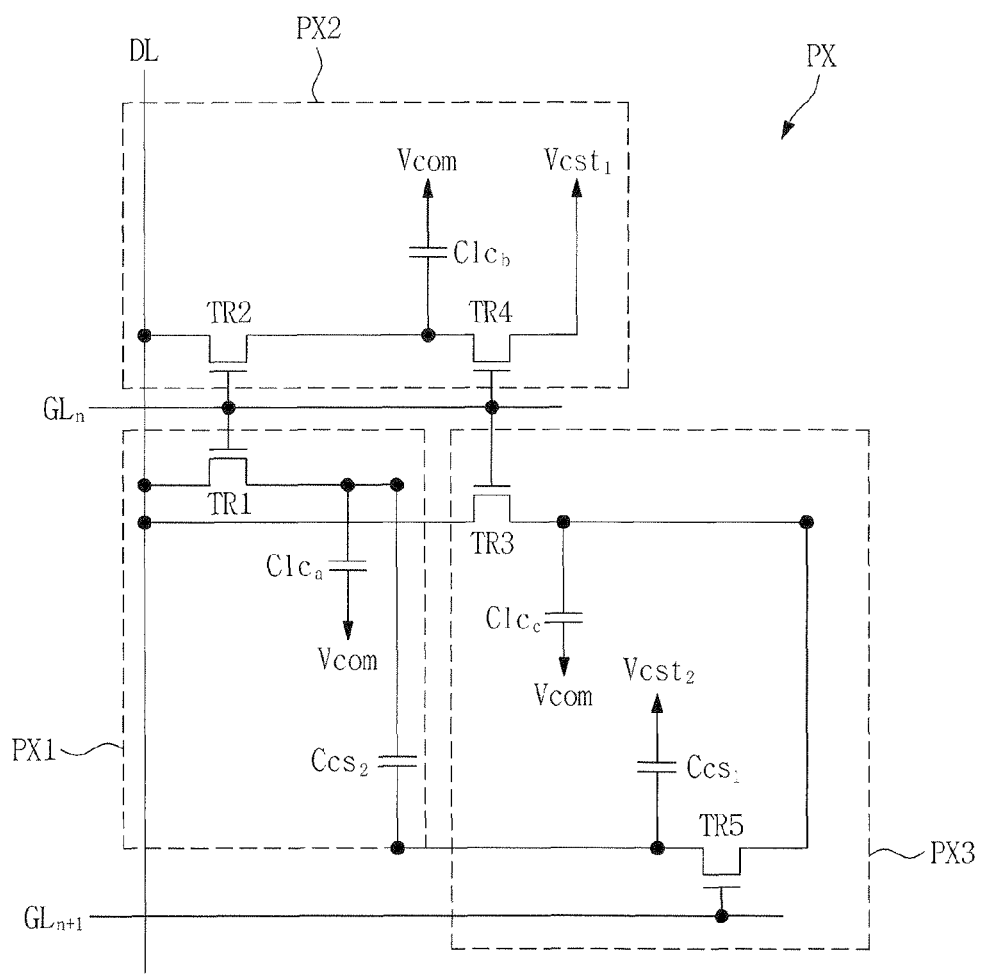
FIG. 5 is an equivalent circuit diagram illustrating one pixel of a display panel according to another embodiment of the present invention.
Figure 6:
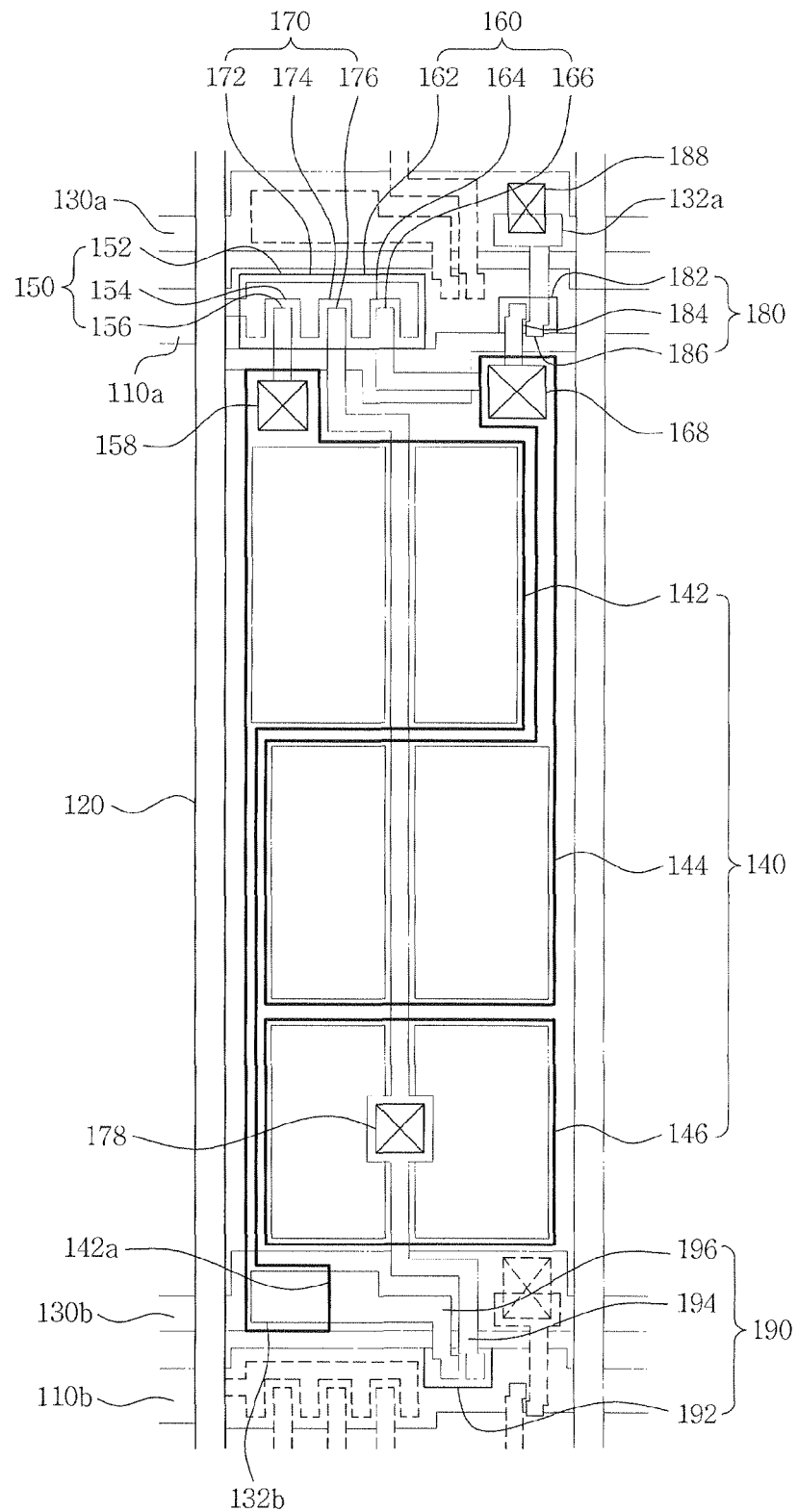
FIG. 6 is a plan view illustrating the display panel of FIG. 5.

FIG. 5 is an equivalent circuit diagram illustrating a pixel of a display panel according to another embodiment of the present invention and FIG. 6 is a plan view illustrating the display panel of FIG. 5.

Referring to FIGS. 5 and 6, the display panel according to another embodiment of the present invention is consistent with the display panel of FIGS. 3 and 4, except for the first sub-pixel electrode 142 and therefore the repeated description will not be provided for brevity.

A part of the first sub-pixel electrode 142*a* may be extended toward the second storage electrode line 130*b* along the data line 120 and overlap the second storage electrode 132*b*. That is, when the gate signal may be applied to the second gate line 110*b*, a fraction of the data voltage applied to the third sub-pixel electrode 146 may be stored in the second storage electrode 132*b* through the fifth thin film transistor 190. Accordingly, a second charge share capacitor $Ccs_2$ may be formed between the part of the first sub-pixel electrode 142*a* and the second storage electrode 132*b*, thereby boosting the first sub-pixel electrode 142. Therefore, the voltage level applied to the first sub-pixel electrode 142 can be increased more, thereby achieving a wide viewing angle and also improving light transmission.

From the foregoing, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting of the true scope and spirit of the present teachings.

What is claimed is:

1. A display panel comprising:
    a pixel electrode comprising first, second, and third sub-pixel electrodes that are separated from each other;
    a first thin film transistor connected to the first sub-pixel electrode;
    second and fourth thin film transistors connected to the second sub-pixel electrode;
    third and fifth thin film transistors connected to the third sub-pixel electrode;
    a first gate line connected to the first to fourth thin film transistors;
    a second gate line connected to the fifth thin film transistor;
    a data line insulated from and intersecting the first and second gate lines and connected to the first to third thin film transistors;
    a first storage electrode line disposed adjacent to the first gate line; and
    a second storage electrode line disposed adjacent to the second gate line;
    wherein the third thin film transistor is connected to the first thin film transistor via the data line.

2. The display panel of claim 1, wherein the first to third sub-pixel electrodes are sequentially disposed between the first and second gate lines.

3. The display panel of claim 1, wherein the first to third sub-pixel electrodes are respectively applied with voltage different from each other.

4. The display panel of claim 3, wherein the voltage applied to the first sub-pixel electrode is higher than the voltage applied to the second and third sub-pixel electrodes and the voltage applied to the third sub-pixel electrode is higher than the voltage applied to the second sub-pixel electrode.

5. The display panel of claim 1, wherein one of the first to third sub-pixel electrodes comprises a plurality of slits.

6. The display panel of claim 1, wherein the first to third thin film transistors comprise a gate electrode connected to the first gate line, a source electrode connected to the data line, and a drain electrode respectively connected to the first to third sub-pixel electrodes, and
wherein the gate and source electrodes of the first to third thin film transistors are respectively connected to each other.

7. The display panel of claim 6, wherein the drain electrode of the third thin film transistor overlaps the first and second sub-pixel electrodes.

8. The display panel of claim 6, wherein the fourth thin film transistor comprises a gate electrode connected to the first gate line, a source electrode connected to the second sub-pixel electrode, and a drain electrode connected to a first storage electrode.

9. The display panel of claim 8, wherein the first storage electrode is connected to the first storage electrode line.

10. The display panel of claim 6, wherein the fifth thin film transistor comprises a gate electrode connected to the second gate line, a source electrode connected to the third sub-pixel electrode, and a drain electrode connected to a second storage electrode.

11. The display panel of claim 10, wherein the second storage electrode overlaps the second storage electrode line.

12. The display panel of claim 11, wherein the second storage electrode overlaps the first sub-pixel electrode.

13. A display device comprising:
a first substrate;
gate and data lines intersecting each other on the first substrate;
a storage electrode line disposed in parallel with the gate line;
a pixel respectively connected to the gate, data, and storage-electrode lines;
a second substrate facing the first substrate and comprising a common electrode; and
a liquid crystal layer interposed between the first and second substrates, wherein the pixel comprises:
a pixel electrode comprising first, second, and third sub-pixel electrodes that are separated from each other, and
thin film transistor comprising a first thin film transistor connected to the first sub-pixel electrode, second and fourth thin film transistors connected to the second sub-pixel electrode; and third and fifth thin film transistors connected to the third sub-pixel electrode;
wherein the third thin film transistor is connected to the first thin film transistor via the data line.

14. The display device of claim 13, wherein the gate line comprises a first gate line and a second gate line spaced apart from the first gate line, and
wherein the first to fourth thin film transistors are connected to the first gate line and fifth thin film transistor is connected to the second gate line.

15. The display device of claim 14, wherein the storage electrode line comprises a first storage electrode line disposed adjacent to the first gate line and a second storage electrode line disposed adjacent to the second gate line,
the fourth thin film transistor is connected to the first storage electrode line, and
the fifth thin film transistor overlaps the second storage electrode line.

16. The display device of claim 14, wherein the first to third sub-pixel electrodes are sequentially disposed between the first and second gate lines.

17. The display device of claim 13, wherein the first to third sub-pixel electrodes are respectively applied with voltage different from each other.

18. The display device of claim 17, wherein the voltage applied to the first sub-pixel electrode is higher than the voltage applied to the second and third sub-pixel electrodes and the voltage applied to the third sub-pixel electrode is higher than the voltage applied to the second sub-pixel electrode.

19. The display device of claim 13, wherein one of the first to third sub-pixel electrodes comprises a plurality of slits.

* * * * *